United States Patent

Sakata et al.

Patent Number: 5,951,282
Date of Patent: Sep. 14, 1999

[54] VERTICAL HEAT TREATMENT APPARATUS

[75] Inventors: Kazunari Sakata, Sagamihara; Tamotsu Tanifuji, Yamato; Akihiko Tsukada, Isehara, all of Japan

[73] Assignee: Tokyo Electron Limited, Tokyo, Japan

[21] Appl. No.: 09/091,420

[22] PCT Filed: Oct. 21, 1997

[86] PCT No.: PCT/JP97/03791

§ 371 Date: Jun. 24, 1998

§ 102(e) Date: Jun. 24, 1998

[87] PCT Pub. No.: WO98/19335

PCT Pub. Date: May 7, 1998

[30] Foreign Application Priority Data

Oct. 31, 1996 [JP] Japan .................................. 8-305653
Oct. 31, 1996 [JP] Japan .................................. 8-305654

[51] Int. Cl.[6] ........................................................ F27D 3/12
[52] U.S. Cl. .............................. 432/241; 432/3; 432/11; 432/152
[58] Field of Search .................................. 432/241, 5, 6, 432/11, 152, 253, 3; 118/724, 725; 392/416, 418; 219/390

[56] References Cited

FOREIGN PATENT DOCUMENTS 63-200523  8/1988  Japan .
1-106423   4/1989  Japan .
6-310432  11/1994  Japan .
7-297257  11/1995  Japan .

Primary Examiner—Teresa Walberg
Assistant Examiner—Jiping Lu
Attorney, Agent, or Firm—Oblon, Spivak, McClelland, Maier & Neustadt, P.C.

[57] ABSTRACT

The vertical heat treatment apparatus for semiconductor wafers (W) includes a heat treatment furnace (19). In the heat treatment furnace (19), the wafers (W) are subjected to a batch treatment in a state mounted on a boat (16). To the lower side of the heat treatment furnace (19), a preparatory vacuum chamber (102) is airtightly connected through a manifold (33). The manifold (33) has first and second parts (33a and 33b) separably coupled to each other, which are connected to the heat treatment furnace (19) and the preparatory vacuum chamber (102), respectively. The second part (33b) defines a valve seat on which a lid (22) is seated to cut off the communication between the heat treatment furnace (19) and the preparatory vacuum chamber (102). In a state where the lid (22) is seated on the valve seat to maintain the preparatory vacuum chamber (102) airtight, the heat treatment furnace (19) can be separated together with the first part (33a) of the manifold from the preparatory vacuum chamber (102) and the second part (33b) of the manifold.

20 Claims, 7 Drawing Sheets

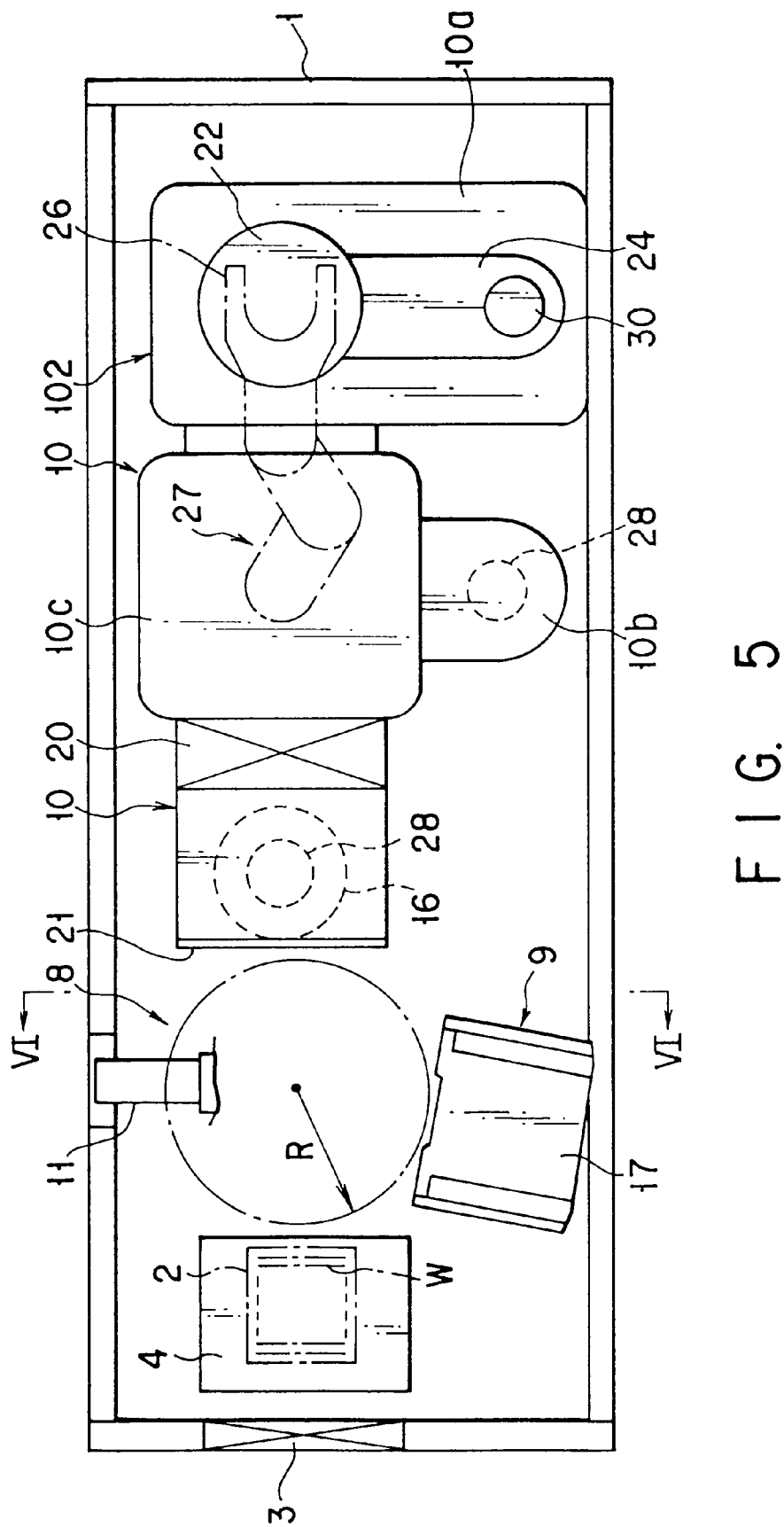
F I G. 5

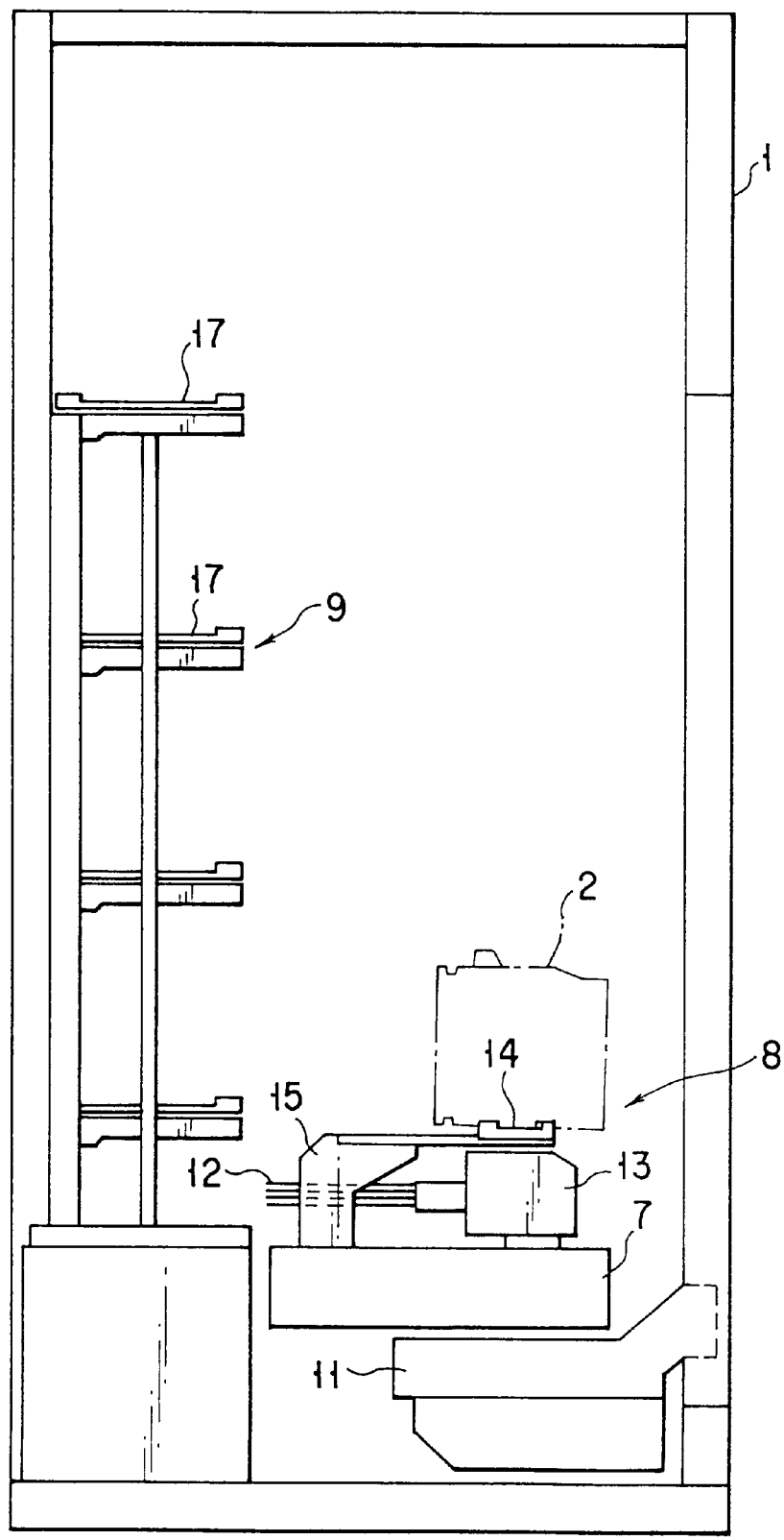
F I G. 6

VERTICAL HEAT TREATMENT APPARATUS

TECHNICAL FIELD

The present invention relates to a vertical heat treatment apparatus for heat treating target substrates, such as semiconductor wafers, and more particularly, to a hot-wall type vertical heat treatment apparatus.

BACKGROUND ART

In the manufacture of semiconductor devices, various heat treatment apparatuses are used in order to apply various treatments, such as oxidation, diffusion, CVD, and so forth, to semiconductor wafers, i.e., the target substrates. As one of such heat treatment apparatuses, there is known a type in which a lord-lock chamber, i.e., a preparatory vacuum chamber is connected to a treatment chamber, i.e., a heat treatment furnace. In the case of this heat treatment apparatus, by previously setting the interior of the preparatory vacuum chamber at approximately the same pressure as that in the heat treatment furnace, the wafers can be transferred in and out by opening the furnace throat without restoring the pressure in the heat treatment furnace to the atmospheric pressure; and thus, the reduction of the required time and the improvement in throughput can be realized.

By the way, in the case of the above-mentioned heat treatment apparatus, it is required to execute the maintenance thereof for the periodical inspection of the heat treatment furnace, the washing of the reaction tube, etc. in order to retain its reliability. In the case of a vertical heat treatment apparatus having its furnace opening or throat in the lower portion thereof, it is structurally possible to open for instance the interiors of the heat treatment furnace and the preparatory vacuum chamber to the atmosphere and to lower the reaction tube etc. into the preparatory vacuum chamber located therebeneath, whereby the maintenance thereof is executed.

However, in the heat treatment apparatus, moisture, dust, etc. are apt to enter the interior of the preparatory vacuum chamber since the preparatory vacuum chamber is opened to the atmosphere. Further, there is another problem that a long period of time must be spent for the re-starting for restoring the interior of the preparatory vacuum chamber to a predetermined degree of vacuum. Further, due to the fact that the heat treatment furnace is moved down into the preparatory vacuum chamber, the preparatory vacuum chamber needs to be formed large; and thus, the whole apparatus is increased in size, which is a problem, too.

There has also been proposed a heat treatment apparatus constructed such that a gate valve is interposed between the heat treatment furnace and the preparatory vacuum chamber, so that, by closing this gate valve, the interior of the heat treating chamber and the interior of preparatory vacuum chamber are cut off from each other. In this case, it is possible to execute maintenance by removing the heat treatment furnace, while maintaining the interior of the preparatory vacuum chamber in vacuum state. However, in this heat treatment apparatus, the apparatus is increased in size by an amount corresponding to the gate valve. Further, it is necessary to manufacture the gate valve in accordance with special specifications for a water-cooling structure to protect the gate from thermal influence. Therefore, the apparatus not only becomes structurally complicated, but also there is a problem that the products resulting from the water cooling attach, causing the formation of particles.

Further, also known is a vertical heat treatment apparatus having a lid movable up and down, which opens or closes the furnace throat formed in the lower portion of the heat treatment furnace. On the lid, a quartz-made boat, i.e., a substrate holding member which can hold a plurality of wafers is placed through a quartz-made heat insulation cylinder. The boat and the heat insulation cylinder are inserted into the furnace, whereby heat treatment is applied to the wafers for film formation etc. In such a vertical heat treatment apparatus, films are also formed on the boat and the heat insulation cylinder, so that to perform maintenance works, such as the washing or replacement of the members periodically or when required, becomes necessary.

However, in the case of the above-mentioned vertical heat treatment apparatus, the boat and the heat insulation cylinder must be taken out by opening the preparatory vacuum chamber to the atmosphere, in order to perform the maintenance works for the boat and the heat insulation cylinder. As a result, there arises a problem that, moisture, dust, etc. are apt to enter the preparatory vacuum chamber, which has been opened to the atmosphere, and a considerable period of time must be spent for the re-starting for restoring the interior of the preparatory vacuum chamber to a predetermined degree of vacuum.

DISCLOSURE OF INVENTION

Thus, it is an object of the present invention to provide a vertical heat treatment apparatus constructed such that the maintenance of the heat treatment furnace (treatment chamber) etc., can be performed without opening the interior of the preparatory vacuum chamber to the atmosphere.

According to a first aspect of the present invention, there is provided a vertical heat treatment apparatus for applying a heat treatment, in a batch, to a plurality of target substrates which belong to a group of substrates having substantially the same contour size, comprising:

an airtight treatment chamber for accommodating the target substrates therein;

a holding member for holding the target substrates, in the treatment chamber, in a stacked state with intervals therebetween;

a supplying system for supplying a treating gas into the treatment chamber;

heating means for heating an internal atmosphere of the treatment chamber;

a preparatory vacuum chamber airtightly connected to the treatment chamber;

a lid for selectively shutting off the communication between the treatment chamber and the preparatory vacuum chamber;

an exhaust system for exhausting the treatment chamber and the preparatory vacuum chamber and, further, setting the treatment chamber and the preparatory vacuum chamber to vacuum independently of each other; and a manifold which airtightly connects the treatment chamber and the preparatory vacuum chamber to each other and is connected to the supplying system, the manifold comprising first and second parts separably coupled to each other, the first and second parts being connected to the treatment chamber and the preparatory vacuum chamber, respectively, the second part defining a valve seat on which the lid is seated to shut off the communication between the treatment chamber and the preparatory vacuum chamber from each other, wherein, in a state where the lid is seated on the valve seat to maintain the preparatory vacuum chamber airtight, the treatment chamber can be separated, together with the first part of the manifold, from the preparatory vacuum chamber and the second part of the manifold.

According to a second aspect of the present invention, there is provided a method of disassembling a vertical heat treatment apparatus for applying a heat treatment, in a batch, to a plurality of target substrates which belong to a group of substrates having substantially the same contour size, the apparatus comprising, an airtight treatment chamber for accommodating the target substrates therein, a holding member for holding the target substrates, in the treatment chamber, in a stacked state with intervals therebetween, a supplying system for supplying a treating gas into the treatment chamber, heating means for heating an internal atmosphere of the treatment chamber, a preparatory vacuum chamber airtightly connected to the treatment chamber, a lid for selectively shutting off the communication between the treatment chamber and the preparatory vacuum chamber, an exhaust system for exhausting the treatment chamber and the preparatory vacuum chamber and, further, setting the treatment chamber and the preparatory vacuum chamber to vacuum independently of each other, and a manifold which airtightly connects the treatment chamber and the preparatory vacuum chamber to each other and is connected to the supplying system, the manifold comprising first and second parts separably coupled to each other, the first and second parts being connected to the treatment chamber and the preparatory vacuum chamber, respectively, the second part defining a valve seat on which the lid is seated to cut off the communication between the treatment chamber and the preparatory vacuum chamber from each other, the method comprising:
 a closing step of seating the lid on the valve seat to bring the preparatory vacuum chamber into an airtight state; and
 a separating step of dividing the first and second parts of the manifold, and separating the treatment chamber together with the first part of the manifold from the preparatory vacuum chamber and the second part of the manifold, while maintaining the airtight state of the preparatory vacuum chamber.

According to a third aspect of the present invention, there is provided a maintenance method for a vertical heat treatment apparatus for applying a heat treatment, in a batch, to a plurality of target substrates which belong to a group of substrates having substantially the same contour size, the apparatus comprising, an airtight treatment chamber for accommodating the target substrates therein, a holding member for holding the target substrates, in the treatment chamber, in a stacked state with intervals therebetween, a supplying system for supplying a treating gas into the treatment chamber, heating means for heating an internal atmosphere of the treatment chamber, a preparatory vacuum chamber airtightly connected to the treatment chamber, a lid for selectively cutting off the communication between the treatment chamber and the preparatory vacuum chamber, wherein the holding member is accommodated in the treatment chamber in a state supported by the lid through a heat insulation cylinder, and an exhaust system for exhausting the treatment chamber and the preparatory vacuum chamber and, further, setting the treatment chamber and the preparatory vacuum chamber to vacuum independently of each other, the method comprising:
 a closing step of bringing the preparatory vacuum chamber into an airtight state;
 a step of separating the treatment chamber from the preparatory vacuum chamber, or taking out the holding member or the heat insulation cylinder from the apparatus, while maintaining the airtight state of the preparatory vacuum chamber; and
 a step of applying maintenance to the treatment chamber, the holding member or the heat insulation cylinder.

BRIEF DESCRIPTION OF DRAWINGS

FIG. 5 is a plan view showing the arrangement of the apparatus shown in FIG. 4.

FIG. 6 is a sectional view taken along the line VI—VI in FIG. 5.

BEST MODE OF CARRYING OUT THE INVENTION

An embodiment of the present invention will now be described in detail on the basis of the accompanying drawings.

Figure 4:
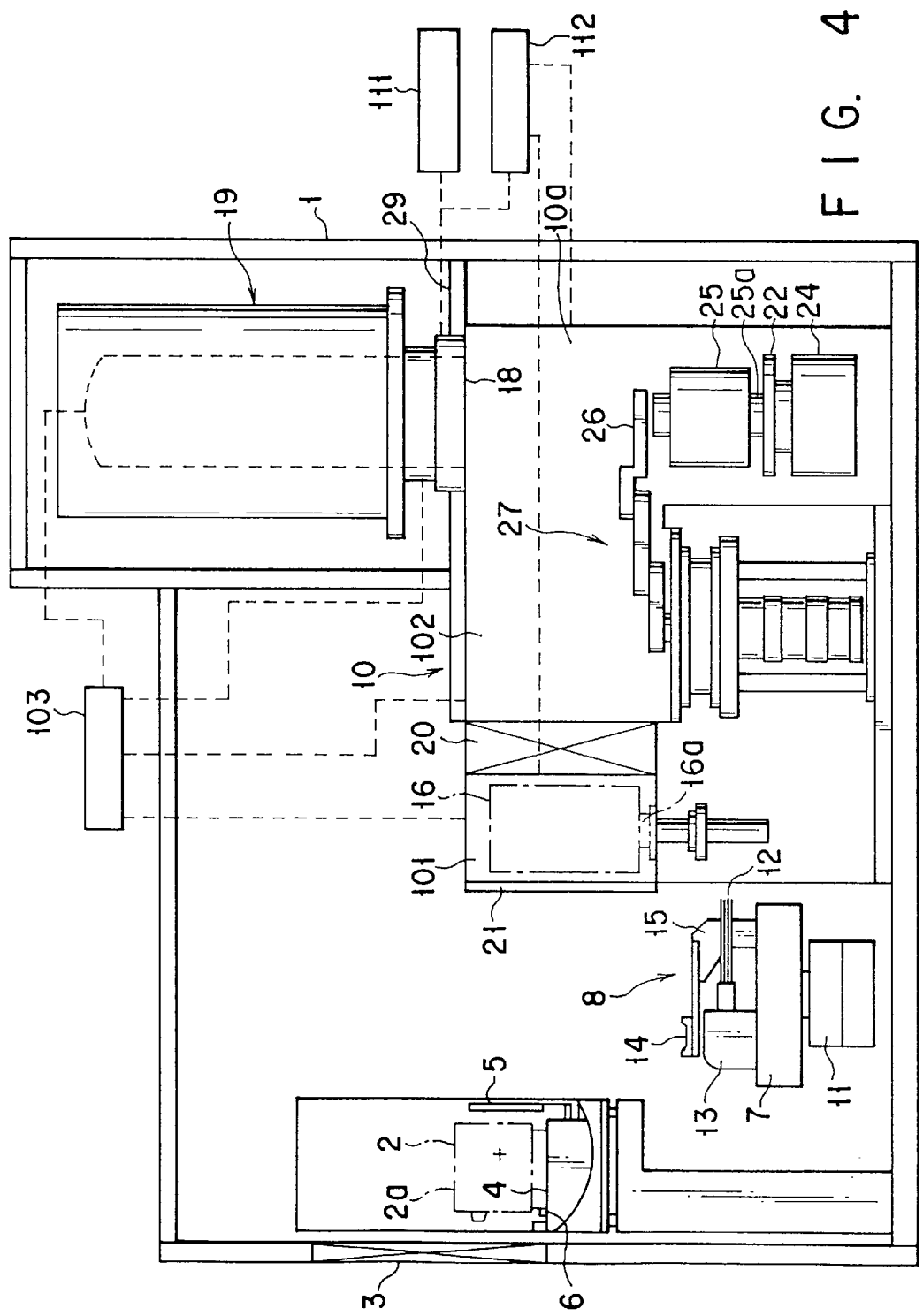
FIG. 4 is a side view showing the arrangement of the vertically heat treatment apparatus according to an embodiment of the present invention.

Referring to FIGS. 4 to 6, the reference numeral 1 denotes a housing of a hot-wall and batch processing type vertical heat treatment apparatus shown, by way of example, as the heat treatment apparatus. Numeral 2 denotes a cassette, i.e., a transferring container in which a plurality of, e.g., about 25, semiconductor wafers W, i.e., target substrates are accommodated in a state held vertically upright and at a predetermined pitch. The cassette 2 has an accommodating opening 2a in the upper portion thereof. At one end of the housing 1, an inlet/outlet port 3 with an opening/closing gate for transferring the cassette 2 in and out. In the housing 1, near the inlet/outlet port 3, there is disposed a table 4 on which the cassette 2 is placed in a vertically upright state with the accommodating opening 2a positioned at the top.

On the table 4, there are disposed holding portions 5 and 6 for holding the cassette 2 from the front and back sides, a orientation flat aligner (not shown) for performing the orientation flat alignment of the wafers W in the cassette 2, etc. Further, the table 4 is disposed so as to be vertically turnable and thus can turn by about 90° the cassette 2 in order to bring the wafers W in the cassette 2 from the vertical state to a horizontal state. In the housing 1, there is disposed a transfer mechanism 8 having a base 7 which is movable up and down and rotatable. Disposed around the base 7 are the table 4, a storing rack 9 for disposing the cassette 2 thereon, and a first preparatory vacuum chamber (also known as load-lock chamber) 101 to be described later.

The transfer mechanism 8 has an up-and-down arm 11 which is disposed so as to be movable up and down by an elevating mechanism using a ball screw etc. On the up-and-down arm 11, the base 7 is mounted so as to be horizontally rotatable. In the up-and-down arm 11, there is a rotation-driving unit (not shown) for rotation-driving the base 7 so as to be able to position the base stand.

On the base 7, there is disposed a wafer handler 13 which has a plurality of, e.g., 5, strip-shaped wafer supporting portions (also known as a fork) extending out horizontally for supporting the wafers W. Also disposed on the base 7 is a cassette handler 15 having a cassette support portion 14 horizontally extending out for supporting the cassette 2 in a state placed thereon. The wafer handler 13 and the cassette handler 15 are opposed to each other and reciprocatingly movable. By the cassette handler 15, the cassette 2 is moved between the table 4 and the storing rack 9. By the wafer handler 13, the wafers W are moved between the interior of the cassette 2 on the storing rack 9 and a boat 16, which will be described later, in the first preparatory vacuum chamber 101.

The cassette support portion 14 is disposed so as to lie directly above the wafer handler 13 in a state where the wafer handler 13 and the cassette handler 15 are at their stand-by positions on the base 7. With this arrangement, the cassette 2 can be rotated in a state where it does not protrude out from the base 7, and thus, the radius R of turning can be reduced. The storing rack 9 has a plurality of, e.g., 4, shelf portions 17 so as to allow a plurality of cassettes 2 to be set in the height direction.

In the upper part at the rear end side of the housing 1, there is disposed an airtight treatment chamber, i.e., a vertical heat treatment furnace 19 with a furnace throat 18 in the lower portion thereof. Continuing to the heat treatment furnace 19, a preparatory vacuum section 10 is airtightly disposed which (load-lock unit) is brought into approximately the same degree of vacuum as the degree of vacuum, e.g., 1 Torr during the heat treatment thereof. In the preparatory vacuum section 10, a horizontal transfer mechanism 27 and a vertical transfer mechanism 23 which will both be described later are disposed. The preparatory vacuum section 10 comprises a first load-lock chamber, i.e., preparatory vacuum chamber, 101 at the side of the inlet/outlet port 3 and a second load-lock chamber, i.e., preparatory vacuum chamber, 102 at the side of the heat treatment furnace 19. Interposed between the first and second preparatory vacuum chambers 101 and 102 is a gate valve 20 for opening and closing the passage therebetween.

The heat treatment furnace 19 and the first and second preparatory vacuum chambers 101 and 102 are connected to a common exhausting mechanism 103. The exhausting mechanism 103 can exhaust the heat treatment furnace 19 and the first and second preparatory vacuum chambers 101 and 102 independently of one another and set the degrees of vacuum thereof to optional values individually. Connected to the heat treatment furnace 19 are a treating gas supplying mechanism 111 for supplying treating gas, e.g., water vapor in the case of an oxidation treatment, and a replacement gas supplying mechanism 112 for supplying a replacement gas, e.g., an inert gas like nitrogen or argon. The replacement gas supplying mechanism 112 is also connected to the first and second preparatory vacuum chambers 101 and 102.

The first preparatory vacuum chamber 101 is used for accommodating the quartz-made boat 16, i.e., a substrate holding member, transferring the wafers W and performing pre-exhaust. The boat 16 is used for inserting a plurality of, e.g., 30, wafers W into the heat treatment furnace 19. The first preparatory vacuum chamber 101 is disposed at a position opposed to the table 4 with the base 7 located therebetween. The front surface portion of the first preparatory vacuum chamber 101 which faces the base 7 has an opening, and, in this front surface portion, there is disposed a vertically sliding type load-lock door 21 for opening or closing this opening portion.

The first preparatory vacuum chamber 101 is controlled to the same pressure as that in the second preparatory vacuum chamber 102 when the gate valve 21 is opened to allow the first preparatory vacuum chamber 101 to communicate with the second preparatory vacuum chamber 102. Further, the first preparatory vacuum chamber 101 is controlled to the same pressure (atmospheric pressure) as that in the housing 1 when the load-lock door 21 is opened to allow the first preparatory vacuum chamber 101 to communicate with the interior of the housing 1 in a state where the gate valve 20 is closed.

The second preparatory vacuum chamber 102 has three areas, i.e., a loading area 10a, a buffer area 10b and a transfer area 10c, which communicate with one another. The loading area 10a is used for transferring the boat 16 into and out from the furnace, beneath the heat treatment furnace 19. The buffer area 10b is used, in case two boats 16 are used, for temporarily placing the boat 16 transferred out from the heat treatment furnace 19 so that the boats 16 do not interfere with each other. In the transfer area 10c, a horizontal transfer mechanism 27 (to be described later) for transferring the boat 16 in the horizontal direction.

In the loading area 10a, a lid 22 for covering or uncovering a throat 18 of the heat treatment furnace 19 is disposed so as to be movable up and down by an up-and-down arm 24 of a vertical transfer mechanism (elevating mechanism) 23. On the lid 22, the boat 16 is placed through a quartz-made heat insulation cylinder 25. The boat 16 is transferred in the vertical direction by the vertical transfer mechanism 23, so that the boat 16 is transferred into the heat treatment furnace 19 and transferred out from the heat treatment furnace 19.

Disposed in the transfer area 10c is the horizontal transfer mechanism 71 having a transfer arm 26 of a multiarticulated arm structure for transferring the boat 16 onto the heat insulation cylinder 25 from the first preparatory vacuum chamber 101 or transferring the boat 16 from on the heat insulation cylinder 25 into the first preparatory vacuum chamber 101 through the buffer area 10b. In this connection, the boat 16 and the heat insulation cylinder 25 can be transferred from on the lid 22 into the first preparatory vacuum chamber 101 by the horizontal transfer mechanism 27 and transferred out from the housing 1 for the purpose of washing or the like.

In order to make it possible to transfer the heat insulation cylinder 25 independently by means of the horizontal transfer mechanism 27 and take it out from the load-lock door 21 through the first preparatory vacuum chamber 101, the boat 16 and the heat insulation cylinder 25 have diameters of substantially the same value, and further, neck portions 16a and 25a thereof also have diameters of substantially the same value. Between the lid 22 and the heat insulation cylinder 25 and between the heat insulation cylinder 25 and the boat 16, positioning means, such as projections and depressions which are engaged with each other should desirably be provided in order to prevent the heat insulation cylinder 25 placed on the lid 22 and the boat 16 placed on the heat insulation cylinder 25 from being shifted in position. Further, on the lid 22, a turn table which is rotatable with the heat insulation table 25 placed thereon can be provided.

The horizontal transfer mechanism 27 does not have the function of moving the boat 16 up and down. Due to this, in the first preparatory vacuum chamber 101 and the buffer area 10b, there is provided a substrate holding member placement stand (also known as boat stand) 28 for placing the boat 16 thereon so as to be movable up and down in order to allow the exchange of the boat 16 between the boat stand 28 and the transfer arm 26. In this connection, the horizontal transfer mechanism 27 can have the function of moving the boat 16 up and down through the transfer arm 26. In this case, the boat stand 28 need not be constructed so as to be movable up and down.

Figure 1:
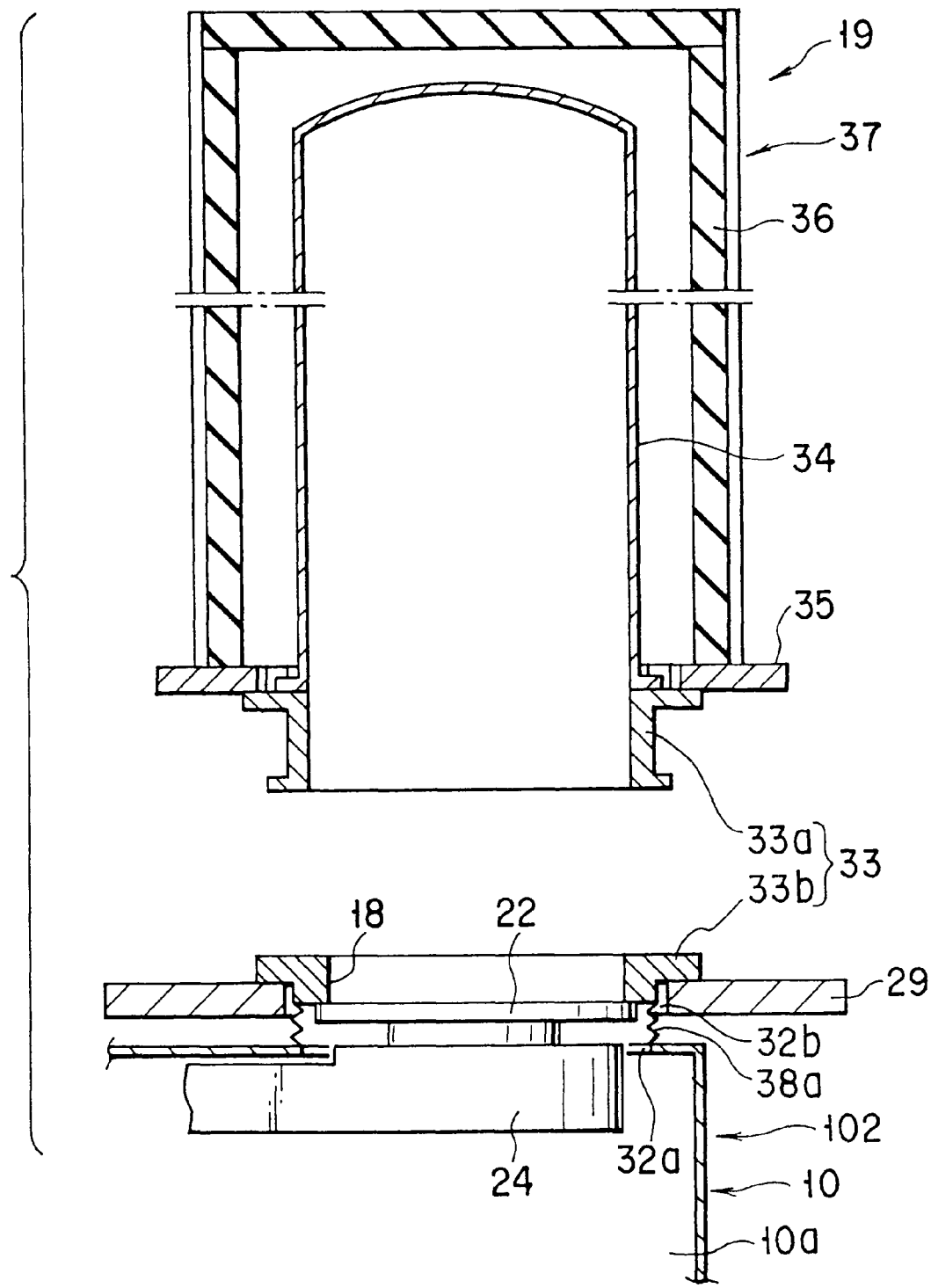
FIG. 1 is a vertically sectioned side view showing a state where a manifold is divided, and a heat treatment furnace is removed in an apparatus shown in FIG. 4.
Figure 2:
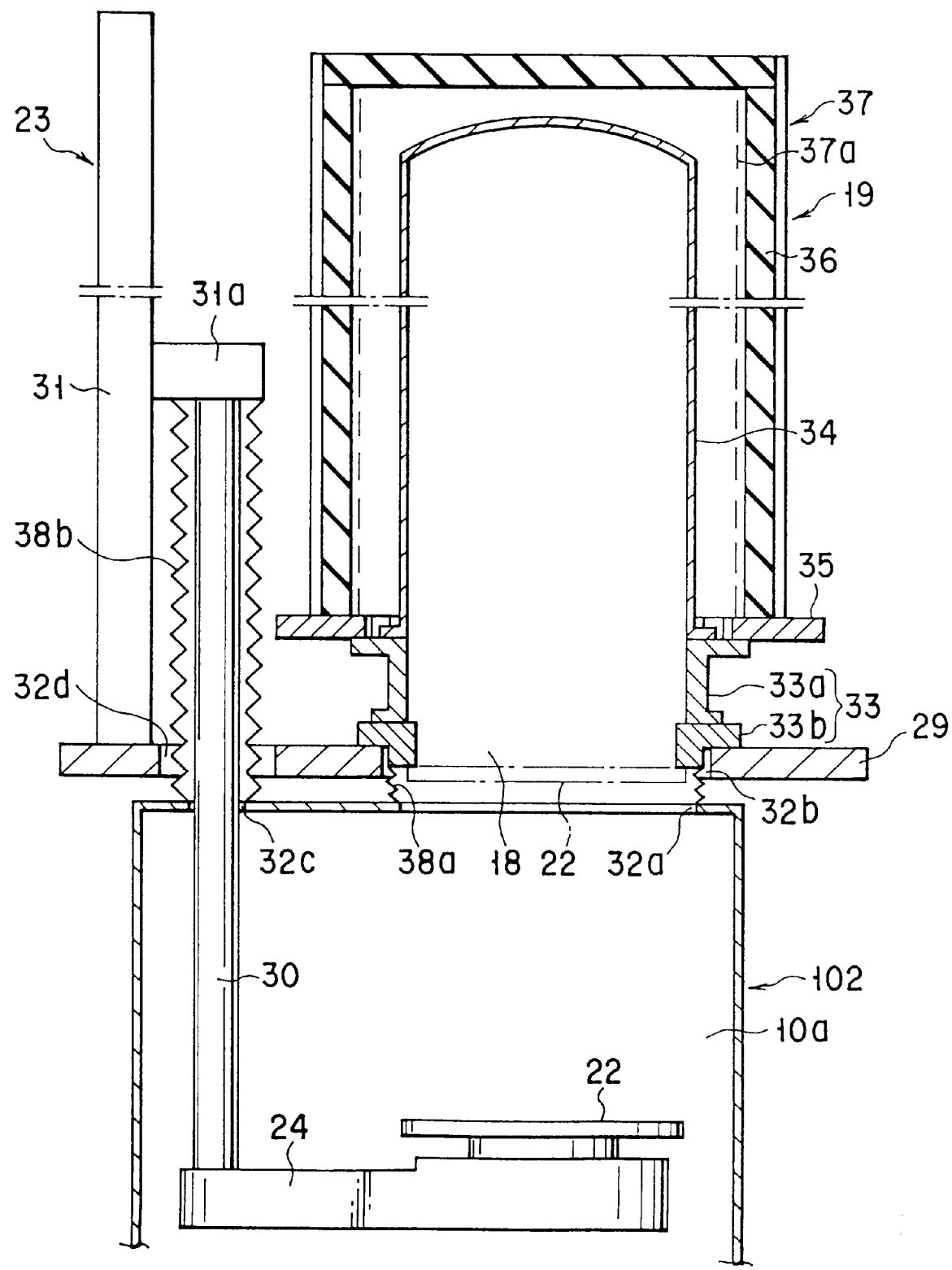
FIG. 2 is a vertically sectioned side view showing the heat treatment furnace and a preparatory vacuum chamber in the apparatus shown in FIG. 4.
Figure 3:
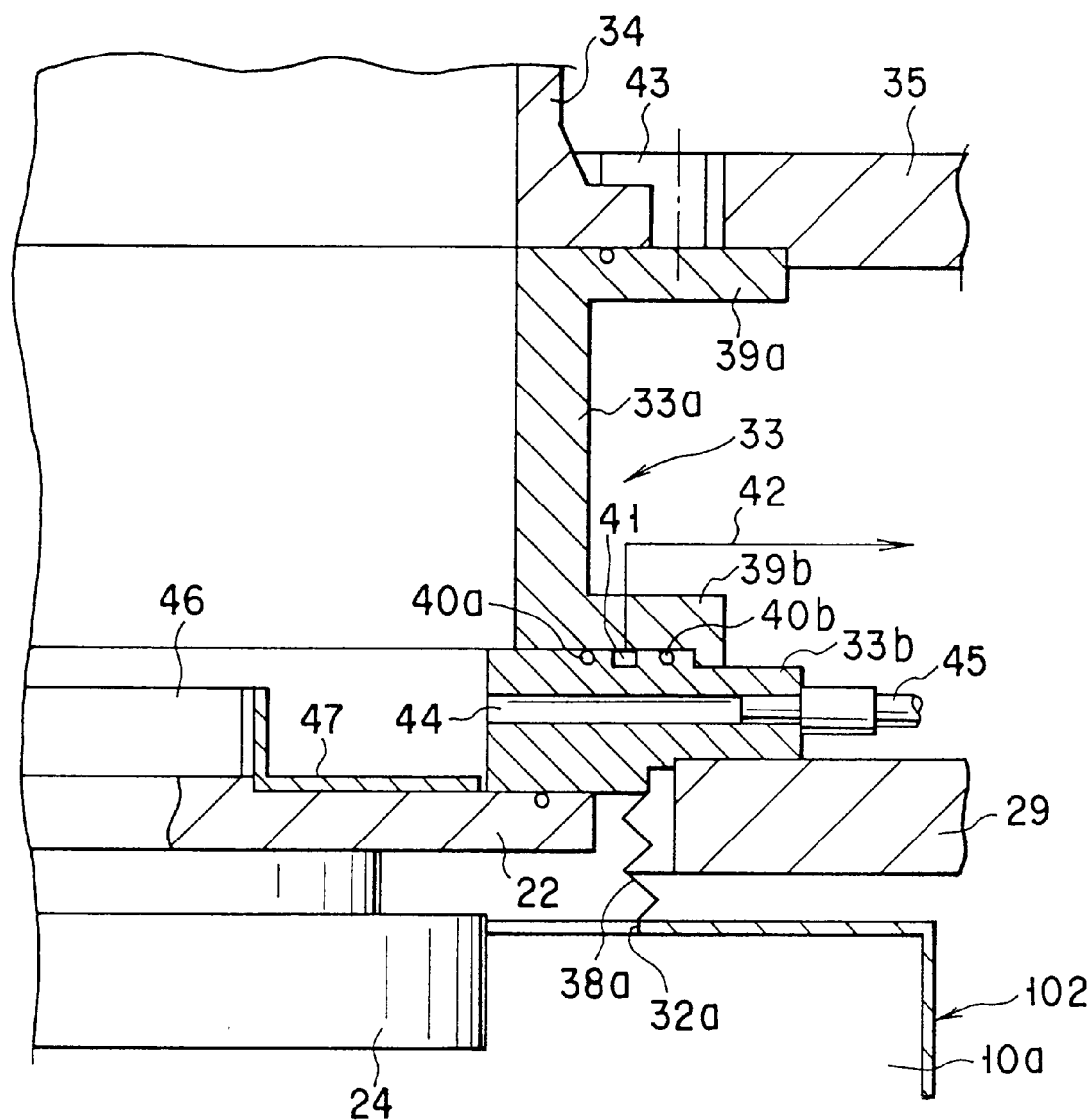
FIG. 3 is an enlarged sectional view showing in detail the manifold of the apparatus shown in FIG. 4.

Above the loading area 10a of the second preparatory vacuum chamber 102, there is disposed a base portion 29 of a mechanical base for supporting the heat treatment furnace 19 and the vertical transfer mechanism 23 as shown in FIGS. 1 to 3. The base portion 29 is mounted to the housing 1 in a laid-down state. The vertical transfer mechanism 23 includes an up-and-down arm 24 and an up-and-down vertical rod 30 connected to the up-and-down arm 24. The up-and-down rod 30 is connected to a movable frame 33a of a driving portion 31, and the driving portion 31 is mounted on the base portion 29.

In the top portion of the second preparatory vacuum chamber 102 and the base portion 29, there are formed openings 32a and 32b corresponding to the throat 18 of the heat treatment furnace 19, and the openings 32c and 32d through which the up-and-down rod 30 of the vertical transfer mechanism 23 extends. The heat treatment furnace 19 has an annular manifold 33 made of, for instance, stainless steel and set on the upper end of the opening 32b formed, for the furnace throat, in the base portion 29. On the upper end of the manifold 33, a reaction tube 34 made of for instance quartz is mounted. Further, on the upper end of the manifold 33, a heater base 35 is also mounted. On the heater base 35, there is mounted a heater 37 composed such that a heater wire 37a is disposed on the inner peripheral surface of a cylindrical heat insulation member 36 covering the reaction tube 34. In this way, the hot-wall type heat treatment furnace 19 whose internal atmosphere is heated to 400° C. or higher and, ordinarily, heated to 600° C. or higher is constituted.

The manifold 33 defines the throat 18 of the heat treatment furnace 19, and the open end thereof is closed up by the lid 22 from the loading area 10a side of the preparatory vacuum chamber 102, whereby the heat treatment furnace 19 and the second preparatory vacuum chamber 102 are cut off from each other. Further, between the edge portion of the opening 32a formed, for the furnace throat, in the second preparatory vacuum chamber 102 and a lower part 33b (to be described later) of the manifold 33, a flexible joint seal for airtight vacuum sealing and, more concretely, bellows 38a which have an axis of expansion and contraction in the vertical direction are airtightly mounted. Also, between the edge portion of the opening 32c for the up-and-down rod and the movable frame 33a connected to the upper end of the up-and-down rod 30, a flexible joint seal for airtight vacuum sealing and, more concretely, bellows 38b which have an axis of expansion and contraction in the vertical direction are airtightly mounted.

The manifold 33 is formed so as to be splittable into portions, upper and lower, in the axial direction. More concretely, as shown in FIG. 3, the manifold 33 is formed of an upper part 33a having flange portions 39a and 39b at both the upper and lower ends thereof and the annular lower part 33b. The lower part 33b is set on the upper end of the opening 32b formed, for the furnace throat, in the base portion 29b and uniformly fixed by means of bolts (not shown). The lower open end of the lower part 33b defines a valve seat on which the lid 22 is seated to cut off the communication between the heat treatment furnace 19 and the second preparatory vacuum chamber 102. On the lower part 33b, the upper part 33a is detachably put. In order to airtightly couple the upper and lower parts 33a and 33b to each other, O-rings 40a and 41b are doubly provided on the upper surface of the lower part 33b. Further, on the lower flange 39b of the upper part 33a, an annular groove 41 extending along the whole periphery is formed so as to be positioned between the two O-rings 40a and 40b. Mounted to the annular groove 41 is a pipe 42 connected to the common exhausting mechanism 103. The ring-shaped space defined, by the O-rings 40a and 40b between the upper and lower parts 33a and 33b and in a state extending along the whole periphery is exhausted through the pipe 42, whereby the upper and lower parts 33a and 33b can be joined and fixed to each other by a uniform force.

On the upper flange portion 39a of the upper part 33a, the reaction tube 34 is disposed and fixed by a holding member 43, and further, the heater base 35 is mounted. In the lower part 33b, there are provided a plurality of gas inlet ports 44 for introducing a treating gas, an inert gas, such as nitrogen or argon, etc. Gas introducing pipes 45 are connected to these gas inlet ports 44. An exhaust port (not shown) for exhausting the interior of the heat treatment furnace 19 to vacuum is provided in the upper end portion of the reaction tube 34 or in the upper flange portion 33a. Referring to FIG. 3, numeral 46 denotes the turn table mounted on the lid 22 for placing the heat insulation cylinder thereon. Numeral 47 denotes a quartz-made cover mounted, for the prevention of corrosion, on the surface of the housing 22 which surface is exposed in the interior of the furnace. In the housing 1, there is provided an opening with a door (not shown) to allow the heat treatment furnace 19 etc. to be transferred in and out for the purpose of maintenance thereof.

Next, the working of the above-mentioned embodiment will be described.

When the cassette 2 in which the wafers W are accommodated in a state held vertically upright is transferred into the housing 2 of the heat treatment apparatus through the inlet/outlet port 3 and placed on the table 4, the cassette 2 is held by the holding portions 5 and 6 from the front and rear sides. After the orientation flat alignment thereof, the cassette 2 is turned by about 90° together with the table 4 in order to bring the wafers W into a horizontal state. As a result, the cassette 2 is brought from the vertical state, in which the accommodating opening 2a is positioned at the top, into the horizontal state, in which the accommodating port 2a is directed in the horizontal direction.

By the upward and downward movement of the up-and-down arm 11, the turning of the base 7, and the movement of the cassette handler 15 in the transfer mechanism 8, the cassette 2 is transferred from the table 4 onto the shelf portion 17 of the storing rack 9. If a predetermined number of cassettes 2 are thus transferred onto the respective shelf portions 17 of the storing rack 9, then, by the upward and downward movement of the up-and-down arm 11, the turning of the base 7 and the movement of the wafer handler 13 in the transfer mechanism 8, the wafers W are transferred from within the cassettes 2 on the storing rack 9 onto the boat 16 to be treated, which has been set on the boat stand 28 in the first preparatory vacuum chamber 101.

When the wafers W are transferred, the gate valve 20 between the first preparatory vacuum chamber 101 and the second preparatory vacuum chamber 102 is closed, while the load-lock door 21 of the first preparatory vacuum chamber 101 is opened. When a predetermined number of wafers W are transferred onto the boat 16, the load-lock door 21 is closed, and the interior of the first preparatory vacuum chamber 101 is exhausted to a predetermined degree of vacuum.

On the other hand, when the heat treatment which is performed in the heat treatment furnace 19 at the same time is finished, the lid 22 is lowered by the up-and-down arm 24 of the vertical transfer mechanism 23, whereby the throat 18 of the heat treatment furnace 19 is opened. Further, the boat 16 already treated and the heat insulation cylinder 25 are let down from within the heat treatment furnace 19 into the loading area 10a of the second preparatory vacuum chamber 102. Next, by the transfer arm 26 of the horizontal transfer mechanism 27, the boat 16 already treated is transferred from on the heat insulation cylinder 25 onto the boat stand 28 in the buffer area 10b and temporarily placed there. Next, the gate valve 20 between the first preparatory vacuum chamber 101 and the second preparatory vacuum chamber 102 is opened, and the to-be-treated boat 16 in the first preparatory vacuum chamber 101 is transferred, by the transfer arm 26, onto the heat insulation cylinder 25 on the up-and-down arm 24 in the loading area 10a. Further, the boat 16 already treated which is in the buffer area 10b is transferred into the first preparatory vacuum chamber 101.

After the transfer of the two boats 16, the gate valve 20 is closed. Next, the lid 22 is moved upwardly by the up-and-down arm 24 of the vertical transfer mechanism 23, whereby the boat 16 to be treated and the heat insulation cylinder 25 are inserted into the heat treatment furnace 19. Further, the furnace throat 18 is closed up by the lid 22, and a predetermined heat treatment is started. On the other hand, the wafers already treated are transferred, from the already treated boat 16 transferred into the first preparatory vacuum chamber 101, into an empty cassette 2 on the storing rack 9. This cassette 2 is transferred from the storing rack 9 to the table 4 and then transferred out through the inlet/outlet port 3.

In the above-mentioned heat treatment apparatus, it is necessary to execute maintenance for the periodical inspection of the heat treatment furnace 19, the washing of the reaction tube 34, etc. In the case of executing the maintenance of the heat treatment furnace 19, first the throat 18 of the heat treatment furnace 19 is closed up by the lid 22 to cut off the interior of the heat treatment furnace 19 and the interior of the second preparatory vacuum chamber 102 from each other. Next, the interior of the heat treatment furnace 19 is opened to the atmosphere, and at the same time, the interior of the second preparatory vacuum chamber 102 is replaced by an inert gas, e.g., nitrogen gas, of the atmospheric pressure.

The opening to the atmosphere of the interior of the heat treatment furnace 19 is performed such that the exhaust is stopped, and the atmosphere is introduced into the reaction tube 34 through the gas inlet port 44 etc. In this case, of course the introduction of the treating gas etc. and the heater are stopped. The reason why the interior of the second preparatory vacuum chamber 102 is replaced by an inert gas with the atmospheric pressure is that, if the heat treatment furnace 19 side is at the atmospheric pressure, while the second preparatory vacuum chamber 102 side is in a vacuum state, then the lid 22 is subject to a reverse pressure (a pressure in the direction for opening the lid), which will cause inconveniences, such as the deformation of the up-and-down arm 24. Further, if the interior of the second preparatory vacuum chamber 102 is opened to the atmosphere, then there arises the problem that a long period of time is spent for the re-starting.

Next, as shown in FIG. 1, the heat treatment furnace 19 is cut off at the separating portion of the manifold 33 and taken out from the housing 1 to perform the maintenance thereof. In this case, first, the atmosphere is introduced into the exhausted annular groove 41 to increase the pressure therein from the vacuum state, whereby the vacuum coupling between the upper and lower parts 33a and 33b is released. In this way, the manifold 33 can be easily divided into the upper part 33a and the lower part 33b. After the heat treatment furnace 19 is taken out from the housing 1, the heater 37 and the reaction tube 34 are removed from the upper part 33a; and maintenance works, such as the inspection of the heater 37 and the washing or replacement of the reaction tube 34 are performed. Further, after the heat treatment furnace 19 is removed from on the lower part 33b of the base portion 29, maintenance works, such as the replacement of the turn table 46 and the quartz cover 47 on the lid 22 can be done, too.

Figure 7:
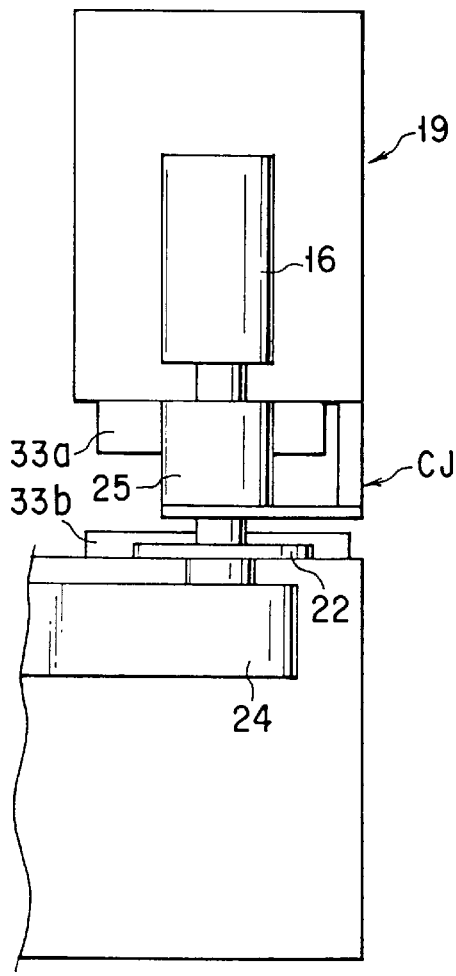
FIG. 7 is a diagram for explaining an operation of removing a boat and a heat insulation cylinder together with the heat treatment furnace in the apparatus shown in FIG. 4.
Figure 8:
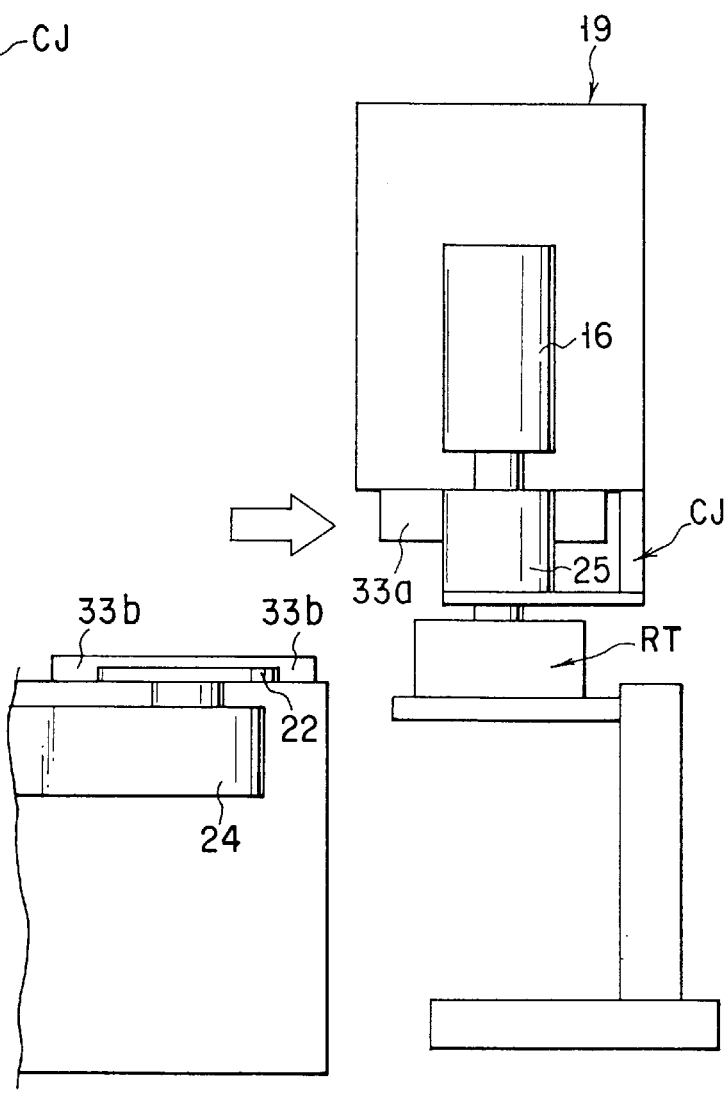
FIG. 8 is a diagram showing a state where the boat and the heat insulation cylinder are removed, together with the heat treatment furnace, from the apparatus shown in FIG. 4.

In the above-mentioned vertical heat treatment apparatus, when heat treatment is performed for the formation of films on the wafers etc, films are also formed on the boat 16 and the heat insulation cylinder 25. Due to this, it becomes necessary to perform maintenance work, such as the washing or replacement of the boat 16 and the heat insulation cylinder 25 periodically or every time the film thickness of the films formed reach a predetermined value. In the case of the above-mentioned maintenance method for the heat treatment furnace 19, maintenance work can be performed by removing the boat 16 and the heat insulation cylinder 25 together with the heat treatment furnace 19 as shown in FIG. 7 and FIG. 8.

In this case, first the lid 22 is moved upwardly with the empty boat 16 and the heat insulation cylinder 25 held thereon to accommodate the boat 16 and the heat insulation cylinder 25 within the heat treatment furnace 19. Further, the throat 18 of the heat treatment furnace 19 is closed up by the lid 22 to cut off the interior of the heat treatment furnace 19 and the interior of the second preparatory vacuum chamber 102 from each other. Next, the interior of the heat treatment furnace 19 is opened to the atmosphere, and at the same time, the interior of the second preparatory vacuum chamber 102 is replaced by an inert gas, e.g., nitrogen gas with the atmospheric pressure.

Next, as mentioned above, the heat treatment furnace 19 is separated at the separating portion of the manifold 33. Then, only the heat treatment furnace 19 is somewhat raised from the base portion 29 to expose the lower portion of the heat insulation cylinder 25 located within the heat treatment furnace 19. Next, by a transfer jig CJ, the heat treatment furnace 19, the boat 16 and the heat insulation cylinder 25 are scooped up all together and transferred onto a dedicated relay stand RT positioned outside the housing 1. By so doing, the heat treatment furnace 19, the boat 16 and the heat insulation cylinder 25 can be subjected to maintenance by separating them as required.

In this way, in the above-mentioned heat treatment apparatus, the second preparatory vacuum chamber 102, the interior of which is brought to approximately the same degree of vacuum as that in the interior of the heat treatment furnace 19, is connected to the throat 18 of the heat treatment furnace 19. By the lid 22 which covers or uncovers the furnace throat 18, the interior of the furnace and the second preparatory vacuum chamber 102 are cut off from each other. Further, the manifold 33 which defines the furnace throat 18 is formed so as to be splittable in the axial direction. In the case of the above-mentioned maintenance method, such a structure is utilized to perform maintenance work by separating the heat treatment furnace 19 at the separating portion of the manifold 33 in a state closing up the furnace throat 18 with the lid 22. Due to this, in spite of the fact that no gate valve is provided at the furnace throat 18, maintenance work can be performed by removing the heat treatment furnace 19 and, if necessary, the boat 16 and the heat insulation cylinder 25 without opening the interior of the second preparatory vacuum chamber 102 to the atmosphere.

Therefore, according to the above-mentioned maintenance method, it is not necessary to let down the reaction tube 34 etc. into the second preparatory vacuum chamber 102, so that it is not necessary to excessively increase in size the second preparatory vacuum chamber 102. Further, since no gate valve is provided at the furnace throat 18, the space can be saved accordingly; and, as a whole, the heat treatment apparatus can be compact. In addition, since a gate valve (a water-cooling type of special specifications) is not used, the structure of the apparatus can be simplified, and there is no fear about particles, either.

Further, according to the above-mentioned maintenance method, the interior of the furnace is restored to the atmospheric pressure in a state where the furnace throat 18 is closed up by the lid 22, and further, the interior of the second preparatory vacuum chamber 102 is replaced by an inert gas with the atmospheric pressure; and thereafter, the heat treatment furnace 19 is separated at the separating location of the manifold 33. Due to this, it is possible to eliminate the inconvenience that, during maintenance work, a reverse pressure is applied to the lid 22. In addition, since the interior of the second preparatory vacuum chamber 102 can be maintained in a clean state not exposed to the atmosphere, it is possible to reduce the time required for the re-starting for bringing the interior of the second preparatory vacuum chamber 102 to vacuum again after the maintenance work. Further, the manifold 33 is formed so as to be separable into the upper and lower parts, and in addition, to the lower part 33b, the gas inlet pipes 45 are mounted. Due to this, when the maintenance of the heat treatment furnace 19 and the reaction tube 34 is performed, it is not necessary to remove the gas inlet pipes 45; and thus, the maintenance of the heat treatment furnace 19 and the reaction tube 34 can be easily executed.

Further, in case the support structure for the housing 22 is made so as to be able to withstand the reverse pressure, the interior of the preparatory vacuum chamber 102 need not necessarily be replaced by an inert gas; the maintenance can be performed by separating the heat treatment furnace in a state where the interior of the preparatory vacuum chamber 102 is held in vacuum. Further, as the means for coupling the upper and lower parts 33a and 33b to each other, bolts or the like can be used.

In the above-mentioned vertical heat treatment apparatus, it is also possible to perform the maintenance, without removing the heat treatment furnace 19, by taking out the boat 16 and the heat insulation cylinder 25 through the load-lock door 21 of the first preparatory vacuum chamber 101. If, in this case, the boat 16 lies on the heat insulation cylinder 25 or on the boat stand 28 in the buffer area 10b, then, first, the load-lock door 21 is closed. Subsequently, in a state where the first preparatory vacuum chamber 101 is brought into the same degree of vacuum as that in the second preparatory vacuum chamber 102, the gate valve 20 is opened, the boat 16 is transferred onto the boat stand 28 in the first preparatory vacuum chamber 101 by the transfer mechanism 27.

Next, the gate valve 20 is closed, the interior of the first preparatory vacuum chamber 101 is restored to the atmospheric pressure, the load-lock door 21 is opened, the boat 16 is taken out through the door 21 of the first preparatory vacuum chamber 101 into the housing 1, and further, transferred out from the housing 1, where the maintenance thereof is performed. In this way, the maintenance of the boat 16 can be easily performed, without opening the interior of the second preparatory vacuum chamber 102 to the atmosphere, in a state maintaining the interior in a vacuum state. In case the wafers W are held in the boat 16 transferred into the first preparatory vacuum chamber 101, the wafers W are transferred onto the cassettes 2; and, after the boat 16 is thus emptied, it is taken out from the first preparatory vacuum chamber 101.

In case two boats 16 are used, even if one of the boats is inserted into the heat treatment furnace 18, and thus, the wafers W are under heat treatment, the maintenance of the other boat can be performed. In the case of performing the maintenance of the heat insulation cylinder 25, first the boat 16 is removed from on the heat insulation cylinder 25, in which state, as in the case of the maintenance of the boat 16, the heat insulation cylinder 25 is transferred from on the lid 22 into the first preparatory vacuum chamber 101 by the transfer mechanism 27 as in the case of performing the maintenance of the boat 16. Next, from the door 21 of the first preparatory vacuum chamber 101, the heat insulation cylinder 25 is taken out to subject it to maintenance. After the maintenance thereof, through a procedure opposite to the above-mentioned procedure, the boat 16 and the heat insulation cylinder 25 can be returned to the original positions thereof.

In this way, according to the latter maintenance method mentioned above, it is also possible to subject the boat 16 and the heat insulation cylinder 25 to maintenance by taking them out without opening the interior of the second preparatory vacuum chamber 102 to the atmosphere. Since the interior of the second preparatory vacuum chamber 102 is not opened to the atmosphere, moisture and/or dust never enter. Further, it is not necessary, either, to perform a re-starting for restoring the interior of the second preparatory vacuum chamber 102 to a predetermined degree of vacuum again; and thus, the operating efficiency of the vertical heat treatment apparatus can be improved.

In the above, an embodiment of the present invention has been described in detail by reference to the drawings. However, the present invention is not limited to the above-mentioned embodiment but can be variously modified in design without departure from the gist of the present invention.

We claim:

1. A vertical heat treatment apparatus for applying a heat treatment, in a batch, to a plurality of target substrates which belong to a group of substrates having substantially the same contour size, comprising:

an airtight treatment chamber for accommodating said target substrates therein;

a holding member for holding said target substrates, in said treatment chamber, in a stacked state with intervals therebetween;

a supplying system for supplying a treating gas into said treatment chamber;

heating means for heating an internal atmosphere of said treatment chamber;

a preparatory vacuum chamber airtightly connected to said treatment chamber;

a lid for selectively shutting off the communication between said treatment chamber and said preparatory vacuum chamber;

an exhaust system for exhausting said treatment chamber and said preparatory vacuum chamber and, further, setting said treatment chamber and said preparatory vacuum chamber to vacuum independently of each other; and a manifold which airtightly connects said treatment chamber and said preparatory vacuum chamber to each other and is connected to said supplying system, said manifold comprising first and second parts separably coupled to each other, said first and second parts being connected to said treatment chamber and said preparatory vacuum chamber, respectively, said second part defining a valve seat on which said lid is seated to shut off the communication between said treatment chamber and said preparatory vacuum chamber from each other, wherein, in a state where said lid is seated on said valve seat to maintain said preparatory vacuum chamber airtight, said treatment chamber can be separated, together with said first part of said manifold, from said preparatory vacuum chamber and said second part of said manifold.

2. An apparatus according to claim 1, wherein, between said first and second parts of said manifold, an airtight space is formed, said space being set to a vacuum state while said first and second parts are coupled to each other, said space being brought from said vacuum state into a pressure-applied state when said first and second parts are separated from each other.

3. An apparatus according to claim 2, wherein said space is formed as a ring extending along the whole periphery of said manifold.

4. An apparatus according to claim 1, wherein, to said second part of said manifold, said supplying system is connected.

5. An apparatus according to claim 1, wherein said apparatus comprises a mechanical base which supports said treatment chamber substantially independently of said preparatory vacuum chamber, and a flexible joint seal which airtightly connects said second part of said manifold and said preparatory vacuum chamber to each other.

6. An apparatus according to claim 1, wherein said holding member is accommodated in said treatment chamber in a state supported on said lid.

7. An apparatus according to claim 6, wherein a vertical transfer mechanism for transferring said holding member in a vertical direction through said lid between a load position within said treatment chamber and a stand-by position directly under said treatment chamber and within said preparatory vacuum chamber, and a horizontal transfer mechanism for transferring said holding member in a horizontal direction between said stand-by position and a position outside said preparatory vacuum chamber, are provided in said preparatory vacuum chamber.

8. An apparatus according to claim 7, wherein said holding member is supported on said lid through a heat insulation cylinder.

9. An apparatus according to claim 8, further comprising a transfer jig for removing said holding member and said heat insulation cylinder together with said treatment chamber from said preparatory vacuum chamber in a state where said holding member and said heat insulation cylinder are accommodated in said treatment chamber.

10. An apparatus according to claim 8, wherein said holding member and said heat insulation cylinder each have at the lower side thereof a neck portion for engagement with said horizontal transfer mechanism, said holding member and said heat insulation cylinder have diameters substantially identical with each other, and said neck portions also have diameters substantially identical with each other.

11. An apparatus according to claim 10, further comprising an auxiliary preparatory vacuum chamber connected to said preparatory vacuum chamber through a gate, and a placement table for placing thereon said holding member in said auxiliary preparatory vacuum chamber.

12. Apparatus according to claim 11, wherein said placement table is movable up and down.

13. A method of disassembling a vertical heat treatment apparatus for applying a heat treatment, in a batch, to a plurality of target substrates which belong to a group of substrates having substantially the same contour size, said apparatus comprising, an airtight treatment chamber for accommodating said target substrates therein, a holding member for holding said target substrates, in said treatment chamber, in a stacked state with intervals therebetween, a supplying system for supplying a treating gas into said treatment chamber, heating means for heating an internal atmosphere of said treatment chamber, a preparatory vacuum chamber airtightly connected to said treatment chamber, a lid for selectively shutting off the communication between said treatment chamber and said preparatory vacuum chamber, an exhaust system for exhausting said treatment chamber and said preparatory vacuum chamber and, further, setting said treatment chamber and said preparatory vacuum chamber to vacuum independently of each other, and a manifold which airtightly connects said treatment chamber and said preparatory vacuum chamber to each other and is connected to said supplying system, said manifold comprising first and second parts separably coupled to each other, said first and second parts being connected to said treatment chamber and said preparatory vacuum chamber, respectively, said second part defining a valve seat on which said lid is seated to cut off the communication between said treatment chamber and said preparatory vacuum chamber from each other, said method comprising:

a closing step of seating said lid on said valve seat to bring said preparatory vacuum chamber into an airtight state; and a separating step of dividing said first and second parts of said manifold, and separating said treatment chamber together with said first part of said manifold from said preparatory vacuum chamber and said second part of said manifold, while maintaining the airtight state of said preparatory vacuum chamber.

14. A method according to claim 13, further comprising a step of restoring an interior of said treatment chamber to an atmospheric pressure and a step of replacing an interior of said preparatory vacuum chamber with an inert gas of an atmospheric pressure, between said closing step and said separating step.

15. A method according to claim 14, wherein, between said first and second parts of said manifold, an airtight space is formed, and, while said first and second parts are coupled to each other, said space is set to a vacuum state, and, when said first and second parts are separated from each other, said space is brought from said vacuum state into a pressure-applied state.

16. A method according to claim 15, wherein said space is formed as a ring extending along the whole periphery of said manifold.

17. A method according to claim 13, further comprising, prior to said closing step, a step of inserting, into said treatment chamber, said holding member in a state supported by said lid, wherein, in said separating step, said holding member is removed together with said treatment chamber from said preparatory vacuum chamber in a state where said holding member is accommodated in said treatment chamber.

18. A method according to claim 13, further comprising, prior to said closing step, a step of inserting, into said treatment chamber, said holding member in a state supported by said lid through a heat insulation cylinder, wherein, in said separating step, said holding member and said heat insulation cylinder are removed together with said treatment chamber from said preparatory vacuum chamber in a state where said holding member and said heat insulation cylinder are accommodated in said treatment chamber.

19. A maintenance method for a vertical heat treatment apparatus for applying a heat treatment, in a batch, to a plurality of target substrates which belong to a group of substrates having substantially the same contour size, said apparatus comprising, an airtight treatment chamber for accommodating said target substrates therein, a holding member for holding said target substrates, in said treatment chamber, in a stacked state with intervals therebetween, a supplying system for supplying a treating gas into said treatment chamber, heating means for heating an internal atmosphere of said treatment chamber, a preparatory vacuum chamber airtightly connected to said treatment chamber, a lid for selectively cutting off the communication between said treatment chamber and said preparatory vacuum chamber, wherein said holding member is accommodated in said treatment chamber in a state supported by said lid through a heat insulation cylinder, and an exhaust system for exhausting said treatment chamber and said preparatory vacuum chamber and, further, setting said treatment chamber and said preparatory vacuum chamber to vacuum independently of each other, said method comprising:

a closing step of bringing said preparatory vacuum chamber into an airtight state;

a step of separating said treatment chamber from said preparatory vacuum chamber, or taking out said holding member or said heat insulation cylinder from said apparatus, while maintaining the airtight state of said preparatory vacuum chamber; and a step of applying maintenance to said treatment chamber, said holding member or said heat insulation cylinder.

20. A method according to claim 19, wherein said apparatus comprises an auxiliary preparatory vacuum chamber connected to said preparatory vacuum chamber through a gate, and said method further comprises a step of taking out said heat insulation cylinder through said auxiliary preparatory vacuum chamber.

* * * * *